US010676350B2

(12) United States Patent
Hughes

(10) Patent No.: US 10,676,350 B2
(45) Date of Patent: Jun. 9, 2020

(54) REVERSIBLE ANODIC BONDING

(71) Applicant: ColdQuanta, Inc., Boulder, CO (US)

(72) Inventor: Steven Michael Hughes, Louisville, CO (US)

(73) Assignee: ColdQuanta, Inc., Boulder, CO (US)

( * ) Notice: Subject to any disclaimer, the term of this patent is extended or adjusted under 35 U.S.C. 154(b) by 35 days.

(21) Appl. No.: 16/137,756

(22) Filed: Sep. 21, 2018

(65) Prior Publication Data
US 2020/0095121 A1 Mar. 26, 2020

(51) Int. Cl.
*B81C 3/00* (2006.01)
*C03C 27/00* (2006.01)
*B32B 17/06* (2006.01)
*B32B 7/12* (2006.01)

(52) U.S. Cl.
CPC ............... *B81C 3/001* (2013.01); *B32B 7/12* (2013.01); *B32B 17/06* (2013.01); *B81C 2203/031* (2013.01); *C03C 27/00* (2013.01)

(58) Field of Classification Search
CPC ..... B81C 3/001; B81C 2203/031; B32B 7/12; B32B 17/06; C03C 27/00
See application file for complete search history.

(56) References Cited

U.S. PATENT DOCUMENTS

| 6,077,721 A * | 6/2000 | Fukada | G01L 9/0042 438/125 |
| 6,537,938 B1 * | 3/2003 | Miyazaki | C03C 3/083 501/66 |
| 6,823,693 B1 * | 11/2004 | Hofmann | C03B 37/01205 156/272.2 |
| 7,400,207 B2 * | 7/2008 | Lipp | G04F 5/14 331/3 |
| 2005/0072189 A1 * | 4/2005 | Tudryn | B81C 3/001 65/36 |
| 2011/0048633 A1 * | 3/2011 | Aratake | H03H 9/1014 156/274.4 |

(Continued)

FOREIGN PATENT DOCUMENTS

JP 2012141284 A * 7/2012

OTHER PUBLICATIONS

Plaza et al., "Cathodic Debond of Anodically Bonded Silicon to Glass Wafers", Electrochemical and Solid-State Letters, 3 (8), available Jun. 14, 2000, pp. 392-394 (Year: 2000).*

(Continued)

*Primary Examiner* — Zandra V Smith
*Assistant Examiner* — Jeremy J Joy
(74) *Attorney, Agent, or Firm* — Clifton Leon Anderson

(57) ABSTRACT

Reversible (relatively weak) anodic bonds permit glass and silicon components to be separated without damaging the components so that they can be reused. To this end, chamfered glass with high aluminum content can be used during the original anodic bonding. Anodic bonding is terminated after complete intimate contact is achieved and while the bond is reversible. The high aluminum content impedes further bond strengthening so that the bond does not become non-reversible via contact bonding. The chamfer provides access near the glass-silicon interface for prying the glass off the silicon to effect debonding without damaging the glass or the silicon. Accordingly, the glass, the silicon, or both may be rebounded (rather than being wastefully disposed).

16 Claims, 4 Drawing Sheets

(56) References Cited

U.S. PATENT DOCUMENTS

| | | | |
|---|---|---|---|
| 2012/0298295 A1 | 11/2012 | Youngner et al. | |
| 2013/0068165 A1* | 3/2013 | Forrest | C23C 14/228 |
| | | | 118/733 |
| 2014/0322892 A1* | 10/2014 | Chen | H01L 24/80 |
| | | | 438/455 |
| 2015/0047784 A1 | 2/2015 | Burggraf | |
| 2016/0076308 A1* | 3/2016 | Anderle | C22C 26/00 |
| | | | 175/428 |
| 2016/0229169 A1* | 8/2016 | Yuuki | G01L 1/00 |

OTHER PUBLICATIONS

Corning Incorporated, "Eagle XG® Slim Glass", (Brochure), pp. 1-2, Aug. 2013.

He, Jun et al., "Electric current characteristic of anodic bonding", Journal of Micromechanics and Microengineering,2015, IOP Publishing, United Kingdom, pp. 1-4.

Hoya Candeo Optronics Corporation, "Material Safety Data Sheet (glass): SD2", Apr. 13, 2013, pp. 1-4.

Lee, Thomas M.H. et al., "Detailed characterization of anodic bonding process between glass and thin-film coated silicon substrates", Sensors and Actuators 88 (2000) 103-107, Elsevier, , New York, NY, pp. 103-107.

Schott Technical Glass Solutions, GmbH, "Schott Borofloat®33", (Product Information Sheet), pp. 1-32, Germany, publication date unknown, downloaded Jul. 17, 2018.

\* cited by examiner

REVERSIBLE ANODIC BONDING

BACKGROUND

Ultra-high vacuum systems, e.g., such as those available from ColdQuanta, Inc., for studying ultra-cold matter, may have a silicon body with optical access provided by "windows" of Pyrex® or other borosilicate glasses. These windows may be anodically or otherwise bonded to the silicon to form hermetic seals to maintain an ultra-high vacuum within the silicon body.

There are many situations in which it may be desirable to remove a window. For example, it may be desirable to access the device interior to clean, to replace a spent or defective component, or to exchange an internal component to repurpose the device. However, it can be difficult to break a hermetic glass-silicon bond without damaging the glass, the silicon, and/or heat-sensitive and other components of the UHV system. As a result, it is not uncommon to simply discard and replace a UHV system without salvaging some of its expensive components. What is needed is an approach that permits debonding of glass from silicon that does not lead to costly damage so that separated components can be reused.

DETAILED DESCRIPTION

In accordance with the present invention, a chamfered glass structure is anodically bonded to a silicon structure using an electric field that is terminated after complete intimate contact is achieved and while the maximum strength is below a tensile strength of the glass. The glass composition is selected so that there is a "reversible" time interval over which complete intimate contact can be achieved while the maximum bond strength over the glass-silicon interface is within a reversible bond-strength range. Complete intimate contact can be detected visually or through image analysis. Presence within the reversible time interval can be determined as a function of current through the glass-silicon interface. The aluminum content of the glass can exceed the alkali content of the glass and, depending on the embodiment, can exceed 10-20% by weight of the glass; this impedes or prevents a reversible bond from becoming permanent due to contact bonding.

In the absence of the present invention, anodic bonding can result in bonds that are too strong to allow the bonded components to be separated without damaging one or both components. In addition, there can be glass residue on the silicon and/or silicon residue on the glass which might be difficult to remove. The present invention strives for a strong-enough but not too strong bond that permits debonding without damaging the glass and silicon components. One or both components can then be rebounded to each other or to other components.

Figure 1:
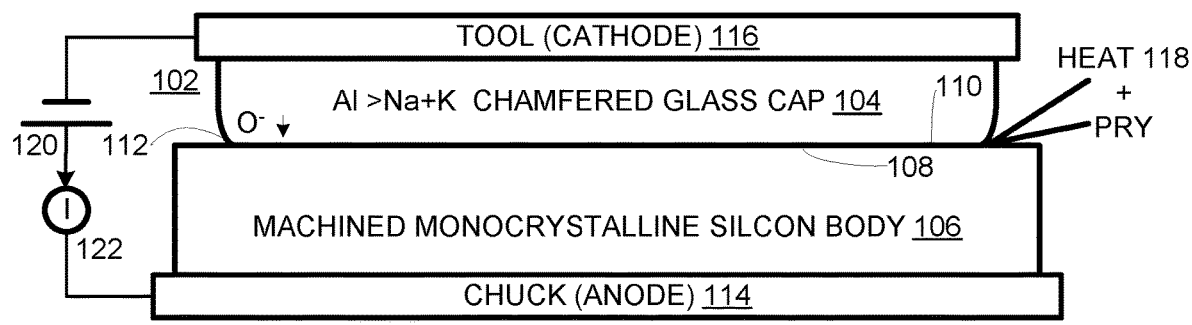
FIG. 1 is a schematic diagram of an anodic bonding setup used to form reversible anodic bonds.

An anodic bonding setup 100 is illustrated in FIG. 1. An assembly 102 includes a chamfered glass cap 104 and a silicon body 106. Glass cap 104 contacts silicon body 106 at a glass-silicon interface 108. Glass cap 104 and glass-silicon surface 108 intersect at a glass-interface surface 110 of glass cap 104. Glass cap 104 is chamfered at 112 so that glass-interface surface 110 is bounded by rounded edges rather than sharp (e.g., 90°) edges. Silicon body 106 can be of monocrystalline silicon, which may have been machined to defined chambers and channels. Glass cap 104 can hermetically seal the chambers and channels while providing optical access thereto.

Herein, "chamfering" refers to modifying a structure in which two surfaces meet at right angles such that the two surfaces do not meet each other, but such that a surface meets an intermediate flat, angled, or curved surface. Chamfer 112 provides access tools and fluids used to pry glass cap 104 from silicon body 106 during debonding. A sharp edge at 112 might concentrate force so that glass at the edge fractures or so that the edge digs into the silicon, damaging the latter. The rounded edge at 112 spreads the force reducing the likelihood of damage. In addition, the rounded edge at 112 yields an electric-field gradient so that the anodic bond is feathered, making delamination less likely. Epoxy and/or clamping can also be used to help prevent delamination of a reversible anodic bond.

Silicon body 106 is mounted on a chuck 114, while glass cap 104 is pressed against silicon body 106 using a tool 116. A heat source 118 is used to elevate assembly 102 to a temperature required for anodic bonding. A power source 120 provides an electric field required for anodic bonding. The electric field is established between chuck 114, which serves as an anode, and tool 116, which serves as a cathode when power source is operated in direct-current (DC) mode. An alternating-current mode is also provided for. A current meter 122 is provided so that electric-field termination can be determined as a function of a time-varying current.

Figure 2:
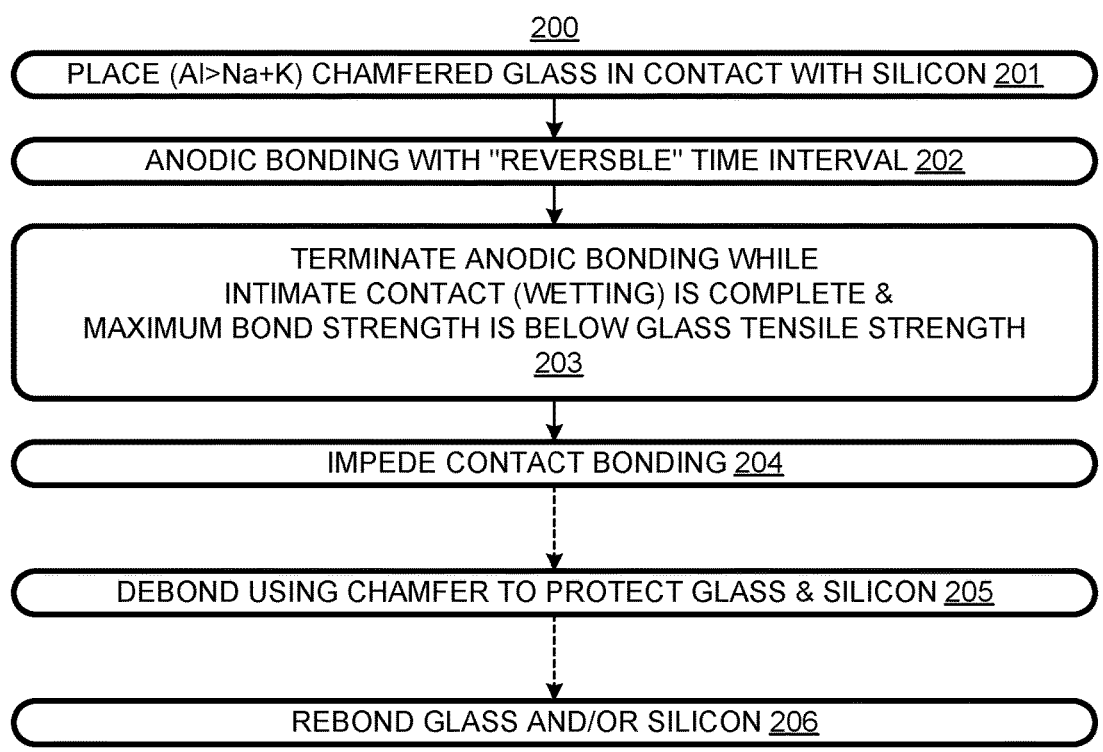
FIG. 2 is a flow chart of a reversible anodic bonding process involving formation of reversible anodic bonds.

A reversible anodic bonding process 200, flow-charted in FIG. 2, can be implemented using anodic bonding setup 100 of FIG. 1 and in other contexts. At 201, a chamfered glass structure can be placed in contact with a silicon structure. More specifically, a glass interface surface of the glass structure can be placed in contact with a silicon interface surface of the silicon structure; the area over which they are in contact is a glass-silicon interface. The glass is chamfered in that edges bounding the glass interface surface are rounded, some of the importance of which accrues during debonding, as explained further below.

The glass has a relatively high aluminum content, e.g., 10-20% or greater of the glass by weight and greater than an alkali, e.g., sodium (Na) and/or potassium (K), content of the glass (in terms of molar percentages). For example, the glass can be an alkali-free boro-aluminosilicate glass, or an alkali-bearing boro-aluminosilicate glass with an aluminum content five or more times that of the alkali content. The high aluminum content is believed to play a role in: 1) ensuring the presence of a "reversible" time interval during anodic bonding, and 2) maintaining the post-bonding reversibility of an anodic bond.

At 202, anodic bonding is performed under conditions for establishing a reversible time interval. Herein, "anodic bonding" encompasses processes for bonding glass to silicon using an electric field, which may be a direct-current (DC) electric field or an alternating-current (AC) electric field; herein, "anodic bonding" is not limited to a particular bonding chemistry. In addition to the electric field, heat is typically applied and pressure may be applied, e.g., using tool 116 of FIG. 1.

Reversible anodic bonding is a "Goldilocks" process in that the bonds must be strong enough to serve their intended purpose, but not so strong that the glass or silicon would be damaged during debonding. Roughly characterized, the time between the time the bond is strong enough and the time the bond is too strong is a "reversible" time interval. However, the concept of a "reversible" time interval is complicated by the fact that anodic bonding does not, in general, proceed uniformly across the glass-silicon interface. Instead, bonds form earlier in some areas than in others. Therefore, the reversible time interval is an interval during which: 1) the weakest bonds are strong enough for the intended purpose; and 2) the strongest bonds are not too strong for reversibility. As explained further below with reference to FIGS. 3A and 3B, glass composition and anodic conditions must be selected to ensure that there is a reversible time interval.

At 203, anodic bonding is terminated. In other words, the electric field is terminated, the glass-silicon assembly is allowed to cool, and any applied pressure may be released. The timing of the termination can be critical. At the very least, intimate contact (wetting) should be complete. Prior to anodic bonding, the glass silicon interface can include air. As bonding proceeds, the air is driven out. The air-fee areas appear wet. When complete intimate contact has been achieved, all air has been expelled (assuming no air is trapped); this condition is readily recognized visually or using image analysis. In addition, anodic bonding must be terminated before the maximum bond strength exceeds a reversible strength threshold, such as the tensile strength of the glass or a lower threshold may be used.

Even after anodic bonding has terminated, a reversible bond can become permanent through a process called "contact bonding", which does not require electric fields or elevated temperatures. In the course of the present invention, it was determined empirically that post-anodic-bonding bond strengthening can be absent or negligible for some glasses having a relatively high aluminum content. Accordingly, the use of high-aluminum content glasses impedes contact bonding at 204 so as to preserve the reversible nature of bonds formed through anodic bonding.

The resulting reversible anodic bond is, of course, weaker, than the conventional permanent anodic bond. As a result, there may be a greater risk of delamination or other failure of the bond. The chamfering may provide for reducing the risk of delamination. During anodic bonding, the chamfering may result in a feathering or gradient at the perimeter of the anodic bond. This feathering may reduce the risk of delamination. As an alternative a thin (typically less than one micron) or permeation barrier coating can be applied to the perimeter to attenuate the bondability of the edges. Once the bond is formed, the chamfer (rounded edge) may serve as a site for an epoxy or other adhesive to supplement the anodic bond and prevent delamination. Also, a physical clamp can be used to prevent the glass from delaminating from the silicon.

Sooner or later it may become desirable to debond and separate the glass from the silicon. By definition, the reversible bond can be debonded. The chamfer facilitates debonding at 205 by serving as a site for tools and fluids (pressurized water or air) to pry the glass from the silicon. The rounded edge(s) resulting from the chamfering help distribute the forces due to prying that might otherwise damage a sharp glass edge or drive the sharp glass edge into the silicon. Once separated, the glass or the silicon or both can be rebounded at 206.

In the course of the invention it was recognized that the bond strength may not be uniform so that the maximum local bond strength may exceed the minimum local bond strength. If some areas of the interface fail to bond, then the resulting defects may render the assembly useless. For example, if the bond is intended to result in a hermetic seal, the unbonded areas of the interface may result in a failed seal and may propagate. On the other hand, if bonding proceeds long enough to ensure that the full interface area is bonded, then some of the interface area that bonded earliest may become too strong for damage-free debonding.

Figure 3A:
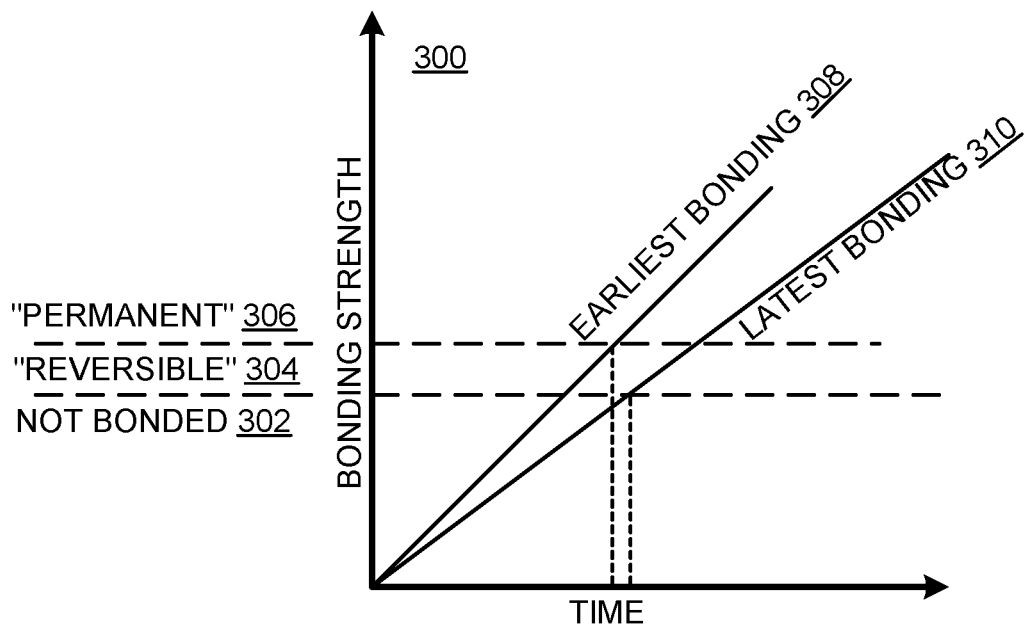
FIGS. 3A and 3B are graphs of bonding strength vs. time showing a case (FIG. 3B) in which a reversible time interval occurs and a case (FIG. 3A) in which a reversible time interval does not occur.
Figure 3B:
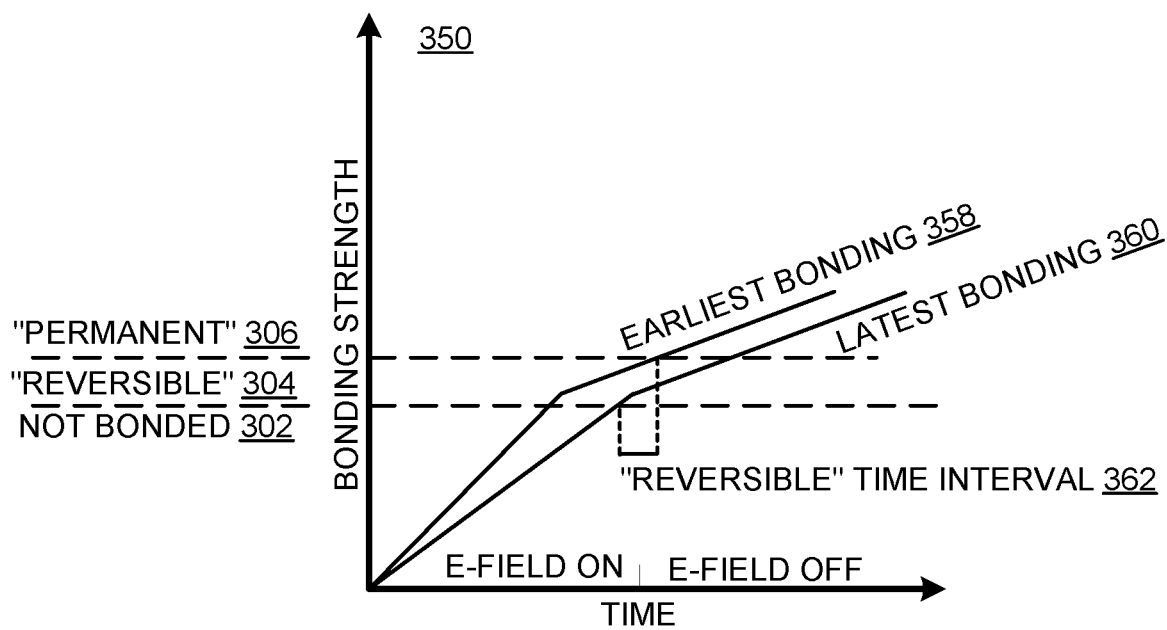

Graph 300 of FIG. 3A shows curves for both an earliest silicon-glass interface area to be bonded and a latest silicon-glass interface area to be bonded. Regions corresponding to three separate strength ranges are identified: unbonded 302, reversible 304, and permanent 306 (meaning not readily debonded without damaging the glass, the silicon, or both). Note that, in FIG. 3A, there is no time at which both the earliest bonded area, represented by curve 308, and the latest bonded area, represented by curve 310, are within the reversible range. Accordingly, it may be impracticable to establish a reversible bond in this scenario. Conversely, some glasses may have an alkali or ion content that is insufficient to affect a permanent bond regardless of bonding process duration.

The present invention provides for reducing the bonding rate, effectively lowering the slopes in reversible region 304 of earliest bonding and latest bonding curves so that there is a "reversible" time interval during which both and therefore all interface areas are within the reversible region, allowing for a reversible bond. In the illustrated embodiment, as represented in graph 350 of FIG. 3B, the rate of bonding decreases as each bond formation reduces the amount of oxygen (or other anion) available for bonding. Thus, while the slopes of the earliest bonding curve 358 and the latest bonding curve 360 within the reversible zone are low to provide for a reversible time interval 362, the slope is higher in the not-bonded region allowing the anodic bonding to proceed more quickly. Halting the electrostatic field during the reversible time interval 362 yields a reversible bond. This raises the challenge of detecting when it is within the reversible time interval. In one aspect of the invention, the reversible time interval is detected based, at least in part, as a function of current.

The material composition of the glass matters. Pyrex® glass and Borofloat® 33 glass are commonly used in UHV applications and can be anodically bonded to silicon. However, efforts to create reversible anodic bonds with these glasses have been largely unsuccessful. On the other hand, several glasses used for smartphone screens have proved suitable for making reversible anodic bonds. In order of decreasing suitability, these glasses include Hoya SD2, Hoya Na32sg, and Corning Eagle XG®. (Pyrex® glass and Eagle XG® glass are products of Corning, Inc. Borofloat® 33 glass is a product of Schott AG. Hoya SD2 and Hoya Na32sg are products of Hoya Corporation.) All of these glasses are borosilicate or boro-aluminosilicate glasses and have a coefficient of thermal expansion (CTE) that closely matches that of silicon over the range of temperatures (e.g., 25-400° C.) used for anodic bonding.

Whereas anodic bonding, by definition, requires an electric field and typically requires elevated temperatures, contact bonding can proceed without an electric field and without elevated temperatures. If an electric field is terminated once a reversible anodic bond has been achieved, contact bonding may continue strengthening the bond until it is no longer reversible. Accordingly, a glass composition that allows for formation of a reversible anodic bond but that restricts contact bonding after the reversible anodic bond is formed is desired.

Empirically, stable reversible anodic bonds were more readily formed using glasses with greater aluminum content than alkali content than using glasses with greater alkali content than aluminum content. The preferred glass, Hoya SD2 has an aluminum content of 20% by weight, while the "runner-up", Hoya Na32sg has an aluminum content of 17% by weight. More generally, it appears that aluminum contents of 10-15% or more can be used effectively in making reversible anodic bonds. By way of suggestion and not of limitation, it may be that, in the absence of an electric field and elevated temperatures, the aluminum effectively competes for the oxygen needed for contact bonding to proceed. Thus, once a reversible bond is formed, a high aluminum content causes it to remain reversible.

Figure 4:
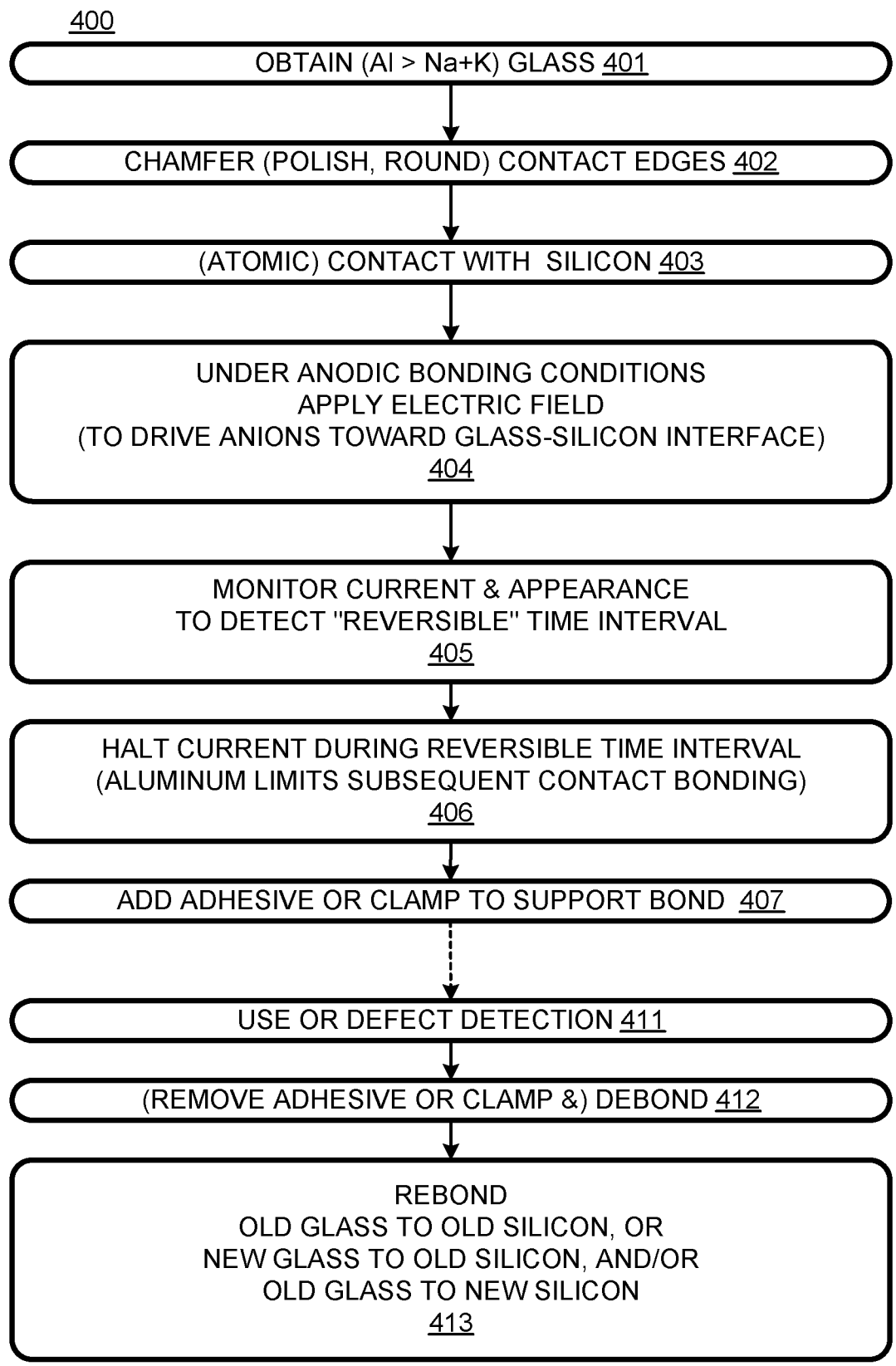
FIG. 4 is a more detailed flow chart of the reversible anodic bonding process of FIG. 2.

A reversible anodic bonding process is flow charted in FIG. 4. At 401, a glass cap is obtained with more aluminum content than alkali content in terms of molar percentages. In some embodiments, the aluminum content can be 10-15-20% or more. At 402, the contact edge or edges is/are "chamfered", e.g., polished or otherwise rounded. In addition, the contact surface may be cleaned, e.g., via polishing or chemical etch or both. Note that, in FIG. 1, the contact edges of the glass cap 104 are rounded, e.g., as a result of polishing.

When the bonds begin to reverse they can often damage the mating material along the sharp perimeter of the glass. To enable damage-free debonding, a light chamfer can be put on the glass, e.g., by lapping from 1000 grit or higher wet-dry sand paper or a lapping plate or etching. The roll-off helps prevent high stresses at the edges that can lead to chips being pulled off the glass and left behind or chips being pulled out of the mating silicon where the sharp bond edge led to stress focusing and bulk fracturing to pull out a chip. Otherwise the bonding surface should have a polished flatness or conformity less than 320 nanometers per inch for highly compliant parts (1 mm thick glass) or flatter for less compliant glasses. Likewise, where possible tapering of the perimeter thickness can help relieve stress to reduce the likelihood of the perimeter starting to debond. Such a taper may involve lapping the opposite side of the perimeter as bonded to thinner than the rest of the bonded part so stress tapers as you approach the perimeter.

At 403, the glass cap is mated to, that is, placed in contact with, a silicon body. For example, pressure applied via chuck 108 and tool 110 (FIG. 1) can force glass cap 104 against silicon body 106. At 404, under anodic bonding conditions, e.g., including temperatures in the range of 150-1000° C., an electric field, e.g., an electrostatic field of 100-1000 V, is applied to drive anions in the glass cap toward the glass-silicon interface.

As shown in FIG. 1, the assembly 102 of glass and silicon is disposed between a chuck 108, which serves as an anode) and a tool 110 (which serves as a cathode). The assembly is heated, e.g., to 300° C. During anodic bonding, a voltage source 114 applies a positive voltage differential, e.g., 250 V) from the anode to the cathode though the assembly 102. In the illustrated setup, plate electrodes (chuck 108 and tool 110) are used to promote a more uniform electrostatic field and temperature across the silicon-glass interface and, thus, a more uniform bonding procedure.

In an alternative embodiment, one or both electrodes can be a point electrode as long as a reversible interval of practical duration is achieved. When using a needle electrode, especially on an insulator like glass, the bond spreads radially to the outside so as not to trap air between the surfaces. The radius of the bonded area is approximately proportional to the square root of time elapsed during the procedure. Temperatures of 350-400° C. or above and bond voltages of 500 to 1000 V can be used.

Figure 5:
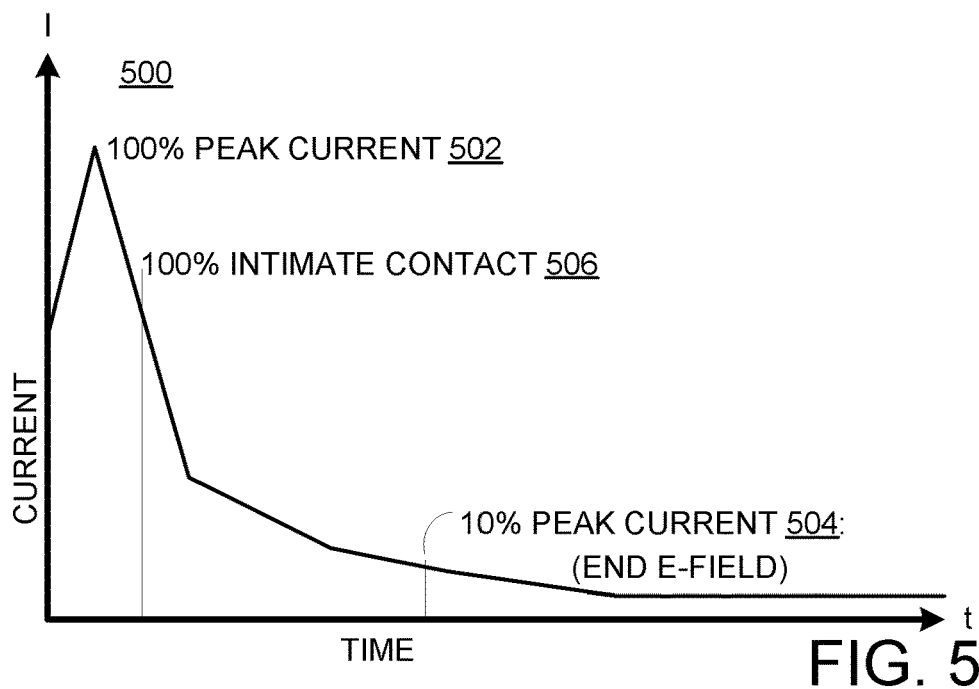
FIG. 5 is a current vs. time graph illustrating how a determination is made regarding when to shut off the electric field used for anodic bonding in the anodic bonding setup of FIG. 1.

In the meantime, at 405 (FIG. 4), the current is monitored/tracked to detect the reversible time interval. In the graph 500 of FIG. 5, the current is tracked. A current peak 502 is detected. When the current falls to 10% of the peak current at 504, the reversible interval is detected provided there is 100% (complete) intimate contact 506, in which case, the silicon-glass interface appears fully wetted (according to visual or other optical detection). If the interface is not fully wetted, then the current is left on (even as the current falls below 10% of peak) until the interface is fully wetted (i.e., complete intimate contact is achieved).

In alternative embodiments, different percentages, e.g., 5%-15%, of the peak current are used. In some embodiments, the appearance of the interface is not considered, and in some embodiments other functions of current are used to detect the reversible interval. For example, the reversible interval can be detected when the rate of change of the current ($\Delta I/\Delta t$) or instantaneous or time averaged dI/dt) falls to a predetermined threshold. Once the reversible interval is detected, the anodic field can be shut down, and other anodic conditions can be relaxed, e.g., temperature can be allowed to fall.

At 406, once the current criterion for detecting the reversible time interval has been met, the appearance of the bond can be checked to ensure the glass-silicon interface is fully wetted. In some embodiments, the appearance of the interface is not checked. At 407, the electric field is removed to halt anodic bonding. In addition, other anodic conditions, e.g., elevated temperature may be relaxed or removed. Typical durations for the electric field can be from about 5 to 20 minutes. The resulting bond can have a strength of 1-6 megapascals and preferably between 2-4 megapascals, below the fracture strength of glass, and well below the strength (10-20 megapascals) of conventional anodic bonds.

The resulting glass-silicon assembly 102 (FIG. 1) is characterized primarily by the bond strength, which can be non-uniform and vary between 1 and 6 megapascals over the glass-silicon interface. Of course, if the glass cap has a rounded edge when the anodic bonding begins, that rounding persists upon completion of the anodic bonding so as to reduce the likelihood of damage during debonding. Bond strengthening due to contact bonding is impeded or prevented, e.g., by the relatively high aluminum content, so that the reversible bond remains reversible long after anodic bonding has completed.

At 407, unintentional perimeter debonding may be delayed or prevented with an adhesive or conformal clamp. The adhesive, which may be an epoxy, can be used to bond rounded glass edges to the silicon. For example, the negative space defined by the chamfering of 402 can be filled with epoxy. An adhesive exhibiting contraction during curing may be preferred to keep the perimeter held down until the seal is removed.

At 411, a manufacturing defect may be detected requiring disassembly. In another scenario, the assembled device is used for some period of time for its intended purpose. In some cases, an internal element requires replacement or replenishment (e.g., an atom source may require refill or replacement) or vacuum or other performance quality needs to be restored or adjusted.

At 412, the glass is debonded from the silicon. In cases in which an adhesive or clamp has been added at 407, the clamp or adhesive may be dissolved or peeled off or otherwise removed in preparation for reversing the bond. Differential heating or cooling especially rapid heating or cooling between the bonded plate and its mating surface, can cause stresses that can initiate debonding at the perimeter. For example, the assembly may be heated and the cap pried off. Clamping or gluing to a negative of the bonded plate and then simply pulling and torqueing may be enough to reverse some bonds as long as the negative pulls from the edges.

Once debonding has begun, further debonding can be encouraged using high-pressure air injection through an air nozzle to propagate a debonding perimeter. The glass should be held in a way to dampen any sudden jump. It can be helpful to actively pull on the glass to be debonded. This pulling can be achieved using tape or gentle adhesive to attach the glass to a mass that is being pulled on before compressed air is applied to the seam. Rather than compressed air, a water jet or other liquid may be allowed to soak in or sprayed in. Liquid can be allowed to capillary into the edge and then cooled to freezing; the expansion due to water freezing can help force the interface surfaces apart.

At 413, one or both of the glass and silicon is/are anodically rebonded. As explained with respect to FIG. 6, 1) "old" glass may be bonded to the old silicon, 2) new glass may be bonded to the old silicon, 3) the old glass may be bonded to new silicon, or 2) and 3) can both occur. Once debonded, if proper surface preparation was done on the initial parts, they should be completely rebondable after re-cleaning and surface prep. The same schedule for heating to the bonding temperature, force, and voltage may be followed, potentially letting the bond soak a little longer. This has the advantage over contact bonding because of the electrostatic assistance of the anodic bond helps with clamping and sealing less conformal parts than contact bonding may be able to achieve. Alternatively, conventional anodic bonding may be used, especially, if a glass cap with relatively high alkali content replaces the original glass cap and a stronger (irreversible) anodic bond is desired.

Figure 6:
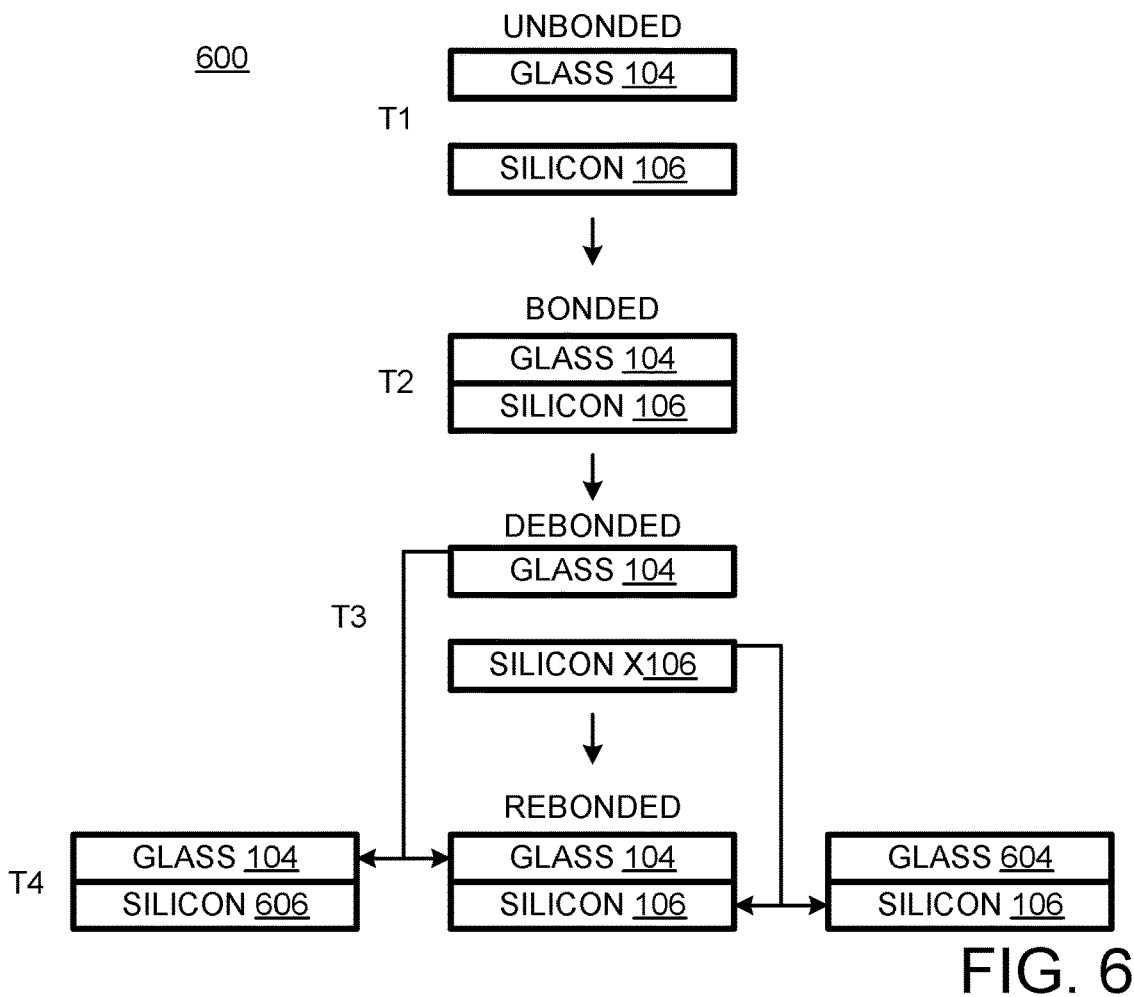
FIG. 6 is a flow diagram of the reversible anodic bonding process of FIG. 2.

The reversible anodic bond makes it practical to debond and rebond as shown for a bond-debond-rebond process 600 charted in FIG. 6. At time T1, glass cap 104 and silicon body 106 are shown separated and unbonded. At time T2, glass cap 104 and 106 are shown bonded to form assembly 102, e.g., from use of setup 100 in FIG. 1. At time T3, glass cap 104 and silicon body 106 are shown debonded and separated. At time T4, at least one of glass cap 104 and silicon body 106 have been rebounded. Either 1) glass cap 104 has been rebounded to silicon body 106, or 2) glass cap 104 has been rebounded to a new silicon body 606, and/or 3) silicon body 106 has been bonded to a new glass cap 604.

As an alternative or supplement to maintaining a reversible bond using high aluminum content glass, other blocking alternatives may be considered. Oils may be used to prevent permanent bonds between mating surfaces but must be UHV compatible. Coatings to the glass may be spatially modulated to spatially modulate block the ions near the surface to prevent or attenuate the bond. Local ion bombardment may be used to locally adjust the available ions for bonding allowing a spatial bondability profile. Glass may be cut and dissolved off with hydrofluoric acid or may be cut and repolished to recover the glass structure for bonding. Silicon may likewise be cleaved to leave a clean surface for rebonding with sacrifice of dimensional thickness with respect to the original part. A bondable surface may be locally slumped with use of careful local heating and highly conformal parts to accommodate thermal expansion mismatch on cooling due to the heating profile.

Herein, glass and silicon are in "contact" even though one or both have a coating of up to one micron that may limit atomic contact between glass and silicon. "Intimate contact", otherwise known as "wetting", occurs as bond formation drives out air from the glass-silicon interface. Intimate contact can be local, so that some areas of a glass-silicon interface are characterized by intimate contact, while others are not. "Complete intimate contact" denotes a condition when the glass and silicon are in intimate contact over the entire area of the glass-silicon interface.

Herein, all art labelled "prior art", if any, is admitted prior art; all art not labelled "prior art", if any, is not admitted prior art. The foregoing embodiments, variations thereupon, and modifications thereto are provided for by the present invention, the scope of which is defined by the following claims.

What is claimed is:

1. A process comprising:
   placing a glass interface surface of a glass structure in contact with a silicon interface surface of a silicon structure so as to define a glass-silicon assembly including a glass-silicon interface, the glass structure having a chamfered edge, wherein the glass interface surface extends to the chamfered edge of the glass structure;
   applying an electric field through the glass-silicon assembly so as to anodically bond the glass structure to the silicon structure at the glass-silicon interface; and
   terminating the electric field after complete intimate contact has been achieved and while the maximum bond strength at the glass-silicon interface is below a tensile strength of the glass, wherein the terminating is while the maximum bond strength at the glass-silicon interface is below six megapascals.

2. The process of claim 1 further comprising:
   while the electric field is being applied, monitoring a current through the glass-silicon interface; and
   while the electric field is applied, detecting when a current-based criterion is met, the current-based criterion being based at least in part on a function of the current through the glass-silicon interface, the terminating being in response to the detection of the current-based criterion being met.

3. The process of claim 2 wherein the detecting includes detecting a magnitude of a peak current and detecting when the current has fallen to a predetermined percentage of the peak current magnitude.

4. The process of claim 1 wherein the glass is a boroaluminosilicate glass or other aluminosilicate glass in which the aluminum content by weight of the glass exceeds the alkali content by weight of the glass.

5. The process of claim 4 wherein the percentage of aluminum in the glass exceeds 15% by weight.

6. The process of claim 5 wherein the chamfered edges are rounded.

7. The process of claim 6 further comprising, after terminating the electric field, apply adhesive to bond a chamfered edge to the silicon.

8. The process of claim 1 further comprising:
   debonding the glass structure from the silicon structure; and rebonding the glass structure to the same or a different silicon structure, or rebonding the silicon structure to a different glass structure.

9. The process of claim 1 wherein the glass is Hoya SD2 glass.

10. The process of claim 1 wherein the silicon is monocrystalline silicon.

11. The product resulting from the process of claim 1.

12. A glass-silicon assembly comprising:
   a silicon structure including a silicon interface surface;
   a glass structure including a chamfered edge and a glass interface surface being bonded to the silicon interface surface with a maximum bond strength across the glass-silicon interface of less than a tensile strength of the glass, the glass interface surface and the silicon interface surface being in complete intimate contact over the glass-silicon interface, the glass interface surface extending to the chamfered edge, the glass being a boro-aluminosilicate glass or other aluminosilicate glass in which an aluminum content by weight exceeds an alkali content by weight, wherein the maximum bond strength is less than six megapascals.

13. The glass-silicon assembly of claim 12 wherein the chamfered edge is bound to the silicon structure by an adhesive.

14. The glass-silicon assembly of claim 13 wherein the adhesive is an epoxy.

15. The glass-silicon assembly of claim 12 wherein the aluminum content of the glass exceeds 15% by weight of the glass.

16. A process comprising:
   placing a glass interface surface of a glass structure in contact with a silicon interface surface of a silicon structure so as to define a glass-silicon assembly including a glass-silicon interface, the glass structure having a chamfered edge, wherein the glass interface surface extends to the chamfered edge of the glass structure;
   applying an electric field through the glass-silicon assembly so as to anodically bond the glass structure to the silicon structure at the glass-silicon interface;
   terminating the electric field after complete intimate contact has been achieved and while the maximum bond strength at the glass-silicon interface is below a tensile strength of the glass;
   debonding the glass structure from the silicon structure; and
   rebonding the glass structure to the same or a different silicon structure, or rebonding the silicon structure to a different glass structure.

* * * * *